United States Patent [19]

Roberts et al.

[11] Patent Number: 4,740,867

[45] Date of Patent: Apr. 26, 1988

[54] PRINTED CIRCUIT CONNECTION SYSTEM

[75] Inventors: Joseph A. Roberts, Hudson; Thomas H. Stearns, Nashua, both of N.H.

[73] Assignee: Advanced Circuit Technology, Inc., Nashua, N.H.

[21] Appl. No.: 30,112

[22] Filed: Mar. 26, 1987

[51] Int. Cl.⁴ .................................... H05K 1/14

[52] U.S. Cl. .................................... 361/398; 439/45; 439/67; 439/329; 439/499; 361/412; 361/413

[58] Field of Search .................... 361/398, 412, 413; 439/45, 52, 62, 64, 65, 67, 329, 493, 499

[56] References Cited

U.S. PATENT DOCUMENTS

| | | | |
|---|---|---|---|
| 4,509,098 | 4/1985 | DasGupta et al. | 361/398 |
| 4,509,099 | 4/1985 | Takamatsu et al. | 361/398 X |
| 4,581,495 | 4/1986 | Geri et al. | 361/398 X |
| 4,587,596 | 5/1986 | Bunnell | 361/398 |
| 4,597,617 | 7/1986 | Enochs | 361/398 X |
| 4,602,317 | 7/1986 | Rovnyak et al. | 361/398 X |
| 4,621,305 | 11/1986 | Daum | 361/398 |

OTHER PUBLICATIONS

Rice et al., Circuit Board Assembly, IBM Tech. Disc. Bull., V. 4, #9, Feb. 1962, p. 7.

IBM Corp., Cable Connector, IBM Tech. Disc. Bull., V. 28 #11, Apr. 1986, pp. 4989 & 4990.

*Primary Examiner*—R. R. Kucia
*Attorney, Agent, or Firm*—Cesari and McKenna

[57] ABSTRACT

A connection system for connecting a flexible circuit having a row of printed contact areas to a PC board having a corresponding row of terminal posts employs a connector having a housing with a bottm wall and a pair of side walls at least one of which is movable with respect to the other. A row of post-receiving passages are present in the bottom wall which passages are arranged to receive the posts of the PC board. An edge margin of the flexible circuit is clamped between the housing side walls so that the contact areas thereon are aligned with the passages in the housing bottom wall and a set of springs positioned inside the housing flexes the circuit edge margin so that when the movable housing side wall is in its closed position, the row of contact areas overhang the passages in the housing bottom wall. Consequently when the connector housing is impaled on the printed PC board posts, the posts project into the housing and are resiliently engaged by corresponding ones of the flexible circuit conductive areas.

16 Claims, 3 Drawing Sheets

PRINTED CIRCUIT CONNECTION SYSTEM

This invention relates to a printed circuit connection system. It relates more particularly to connection apparatus for releasably connecting the terminals of a flexible circuit to wire wrap or terminal posts on a printed circuit board.

BACKGROUND OF THE INVENTION

In electrical systems, flexible printed circuits are often employed as electrical jumpers or cables for interconnecting rows of terminal pins or posts of printed circuit boards comprising the subsystems. A connector, mounted to one or both ends of the jumper, is formed with a set of electrical receptacles or sockets which are designed to receive the terminal posts on the printed circuit board. One type of connector, shown in U.S. Pat. No. 4,225,205, for example, is mounted to the end of the flexible cable and solder connections are made between the circuit terminations of the flexible circuit and various sockets or clips of the connector. Since there may be a large number of such terminations, each one of which must be soldered separately from the others, the attachment of the connector to the flexible circuit can be a time-consuming and tedious process. Furthermore, there is great potential for misconnection of the printed circuit paths to the connector due to solder bridging of adjacent circuit paths or due to a dead solder connection. Also, if connections are to be made in the field, this requires that the technician carry a soldering gun which can be inconvenient. Moreover, the connection is a permanent one.

In another type of connector arrangement, the connector is releasably engaged on the end of the flexible circuit. The connector has a set of spring contacts which resiliently engage the printed circuit paths of the flexible circuit, with the opposite ends of those contacts being soldered to terminal pads or posts of the PC board being connected to. While this type of connection is releasable, it still requires that individual solder connections be made in each circuit path between the two circuits.

U.S. Pat. Nos. 4,531,793 and 4,583,800 are illustrative of connectors which eliminate completely the need to solder when connecting a flexible printed circuit to a printed circuit board. In these systems, the connector is basically a spring-like clamp which clamps the printed circuit paths of the flexible circuit to congruent circuit paths of the PC board. However, this type of connection is possible only when the circuit path terminations of both circuits being connected are planar or flat, i.e. are pads. Such connections could not be used to establish contacts with a PC board whose terminations are upstanding pins or posts.

There is one type of solderless connector of which we are aware which enables one to releasably connect a flexible printed circuit to termimal posts of a PC board. In this arrangement, disclosed in U.S. Pat. No. 4,172,626, a clip having a row of spring members is mounted to the PC board by way of tabs which project through openings in the PC board and are bent over at the underside of the board. The spring members in the clip are arranged so that they are disposed directly opposite the posts of the PC board. The terminal pads of the flexible circuit to be connected to the PC board are arranged so that when the end of the flexible circuit is inserted into a gap between the spring members and the wire wrap posts, the flexible circuit pads are sandwiched and clamped between the spring members of the clip and the posts of the PC board thereby establishing electrical contacts between the terminal pads of the flexible circuit and the posts of the PC board. A special halter impaled on the flexible circuit interfits with the clip to hold the two circuits together. This connection arrangement thus requires that special holes be provided in the PC board being connected to in order to mount the clip. Another set of holes is required in the flexible circuit in order to mount the halter. Also that connector requires an assembly of parts at the connection site in order to couple the two circuits. Such assembly may be difficult to accomplish when the connection site is congested and out of the technician's view. Also, this last-mentioned prior connector must be formed of special metal by a fairly complex rolling operation in order to provide spring members which function as springs as well as current paths between the two circuits being connected.

SUMMARY OF THE INVENTION

Accordingly, the present invention aims to provide a connection system for releasably connecting the printed circuit paths of a flexible circuit to wire wrap posts or pins of a PC board that does not require any solder, crimping or welding operations in order to connect the two circuits.

Another object of the invention is to provide a connection system of this type which can connect reliably very closely packed circuit terminals.

Another object of the invention is to provide such a connection system which has only one moving part.

A further object of the invention is to provide a connector for connecting a flexible circuit to terminal posts of a printed circuit board which does not require that extra holes be formed in the PC board in order to effect the connection.

A further object of the invention is to provide a connector for connecting a flexible cable to terminal posts of a printed circuit board which establishes reliable electrical connections between the corresponding circuit paths of the two circuits.

Another object is to provide such a connector which can be formed for the most part as an inexpensive unitary molded plastic structure.

Yet another object of the invention is to provide a connector of this general type which provides strain relief for the flexible circuit.

Still another object is to provide a connector which is relatively easy and inexpensive to make in quantity.

A further object of the invention is to provide such a connector which can be mounted to the end of a flexible circuit without requiring any tool and which can be coupled to the printed circuit board quite easily and with minimal hand movements and without having to observe the connection site.

Other objects will, in part, be obvious and will, in part, appear hereinafter. The invention accordingly comprises the features of construction, combination of elements and arrangement of parts which will be exemplified in the following detailed description, and the scope of the invention will be indicated in the claims.

Briefly the present connector is mounted to the end of a flexible printed circuit and is arranged to connect planar terminal pads or paths of that flexible circuit to an array of upstanding terminal pins or posts of a PC board of conventional design. Usually those pins or posts are arranged in a row adjacent to an edge of the PC board and the use of my connection system requires no special modification or treatment of that board.

The connector itself comprises a rigid rectangular housing whose length is commensurate with the length of the row of posts on the PC board. A longitudinal edge of the housing is provided with a row of passages which are spaced apart and dimensioned so that the housing can be impaled on the posts. The housing is comprised of a pair of planar support panels which define a cavity inside the housing and are arranged to clamp against opposite surfaces of an end segment of the flexible circuit which carries the circuit's terminal pads. Removably mounted to one of the connector panels inside the cavity are spring means comprised of individual leaf springs or tines which are aligned with the passages in the edge of the housing and which engage the rear face of the circuit. Furthermore, the individual tines or springs are arched or bowed away from that panel so that in their unflexed state, they deflect the flexible circuit so that its terminal pads overlie the row of passages in the edge of the housing.

In order to use the connector to connect a flexible circuit to the PC board, the spacing of the terminal pads of the flexible circuit must correspond to that of the housing passages and to the row of posts on the PC board. Consequently when the connector is impaled on the row of posts projecting from the PC board, the posts protrude into the cavity and deflect the terminal pads,.in opposition to the spring bias thereon, so that a good wiping electrical contact is made between each terminal post of the PC board and each terminal pad of the flexible circuit.

The connector housing can be formed quite inexpensively as a unitary molded plastic structure. The springs may be stamped from a single resilient sheet or be formed individually. The mounting of the springs on the connector panel automatically positions the individual springs or tines at the correct locations relative to the housing passages and the mounting of the connector to the end of the flexible circuit automatically locates the terminal pads of that circuit with respect to both the springs and the passages. Also, since the entire connector is firmly attached to the flexible circuit before connection is made to the PC board, it is quite easy to manipulate the connector in order to couple it to the PC board. Visual access is not even necessary in order to line up the connector housing passages with the row of terminal posts on the PC board; this can be done by feel alone even in a congested area. Likewise, if it should become necessary to disconnect the flexible circuit from the PC board, this can be accomplished quite easily simply by pulling the connector housing away from the PC board. Actually, the two circuits may be connected and disconnected many times without the connector losing its ability to establish good electrical contacts between the circuit paths of the flexible circuit and the circuit paths of the PC board.

The present connection system requires no separate electrical contact elements in the connector itself and no solder joints, welds or crimps in the electrical paths between the two circuits. Rather, the electrical paths are established directly between the terminals or contact areas of the two circuits being connected. Therefore, those contact areas defined primarily by the terminal pads of the flexible circuit can be controlled to the same high tolerance as the printed circuit paths themselves. Furthermore, the pads may be stress-formed and shaped to provide minimum electrical resistance in the connections between the two circuits and maximum contact reliability. Furthermore, since the spring means in the connector is not in the electrical paths between the two circuits, a more resilient material may be used for that member to assure good clamping contacts between the contact areas of the two circuits without compromising the system's current-carrying ability.

With all of these advantages, this connection apparatus is still relatively inexpensive to make in quantity so that it should find wide application wherever it is necessary to releasably connect a flexible circuit to the posts or pins of a PC board.

BRIEF DESCRIPTION OF THE DRAWINGS

For a fuller understanding of the nature and objects of the invention, reference should be had to the following detailed description, taken in connection with the accompanying drawings, in which.

DESCRIPTION OF THE PREFERRED EMBODIMENTS

Figure 1:
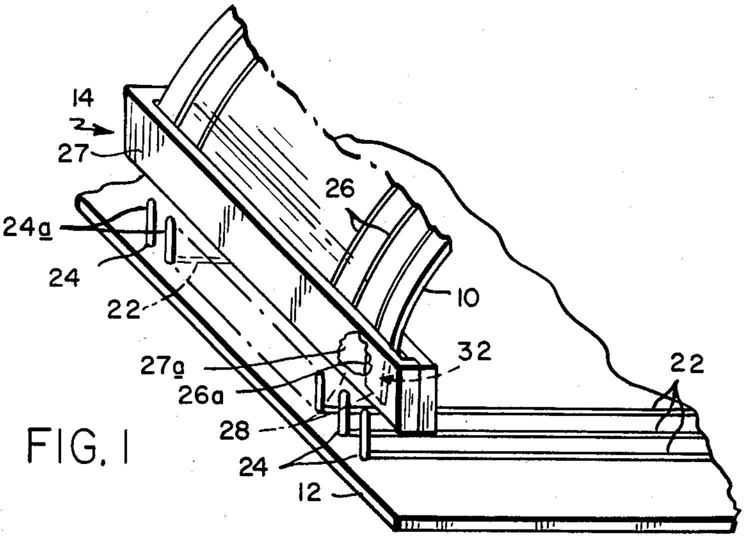
FIG. 1 is a fragmentary exploded isometric view showing a printed circuit connection system embodying this invention.

Referring to FIG. 1 of the drawings, my connection system comprises a flexible circuit or jumper 10 to be releasably connected to a printed circuit board 12 by a connector shown generally at 14. The PC board is a conventional circuit which carries an array of circuit paths 22 which are terminated by upstanding posts or pins 24 arranged in a row on the board, often adjacent to an edge thereof. Typically, these posts are spaced apart only 0.1 inch on center and have tapered ends 24*a*. The flexible circuit or jumper 10 is also of more or less conventional construction in that it has a pattern of printed circuit paths 26 leading to an end of the circuit where those paths are terminated by planar pads 26*a* arranged in a row adjacent to the end of the circuit. In this case, however, circuit 10 is designed to suit the PC board 12 in that the geometry and placement of its terminal pads 26*a* correspond to the geometry and placement of the terminal posts 24 of the PC board. In other words, when the row of pads 26*a* is positioned against the row of posts 24, there is correspondence between the pads and posts.

The connector 14 comprises a rigid housing 27 molded of a suitable thermoplastic resin such as polyethylene terephthalate and mounted to the end of circuit 10. The circuit 10 actually extends into a cavity 27*a* in the housing and the row of terminal pads 26*a* thereon is aligned with a corresponding row of passages 28 formed in a longitudinal edge of the connector and leading into cavity 27*a*. Passages 28, being aligned with pads 26*a*, are also in correspondence with the posts 24 of the PC board 12. Thus, the connector 14 can be impaled on the row of posts 24 so that the posts project through passages 28 into cavity 27*a*, with each post being positioned directly opposite the corresponding pad 26a of the flexible circuit 10.

Located inside connector cavity 27a behind the segment of circuit 10 therein is a comb-like spring member 32. When the connector is impaled on posts 24, member 32 biases the flexible circuit segment in cavity 27a toward the row of posts 24 therein so that each terminal pad 26a of the flexible circuit is urged individually into intimate electrical contact with the corresponding post 24 of the PC board. Thus circuit 10 can be connected to circuit 12 simply by lining up the connector 14 with the row of posts 24 and pressing the connector toward the PC board. Such alignment can be accomplished quite easily by finger manipulation without even having visual access to the connection site. Accordingly, the two circuits 10 and 12 can be connected and disconnected quite easily even if they are located in a relatively congested area of the particular electrical system of which they are a part.

Figure 2:
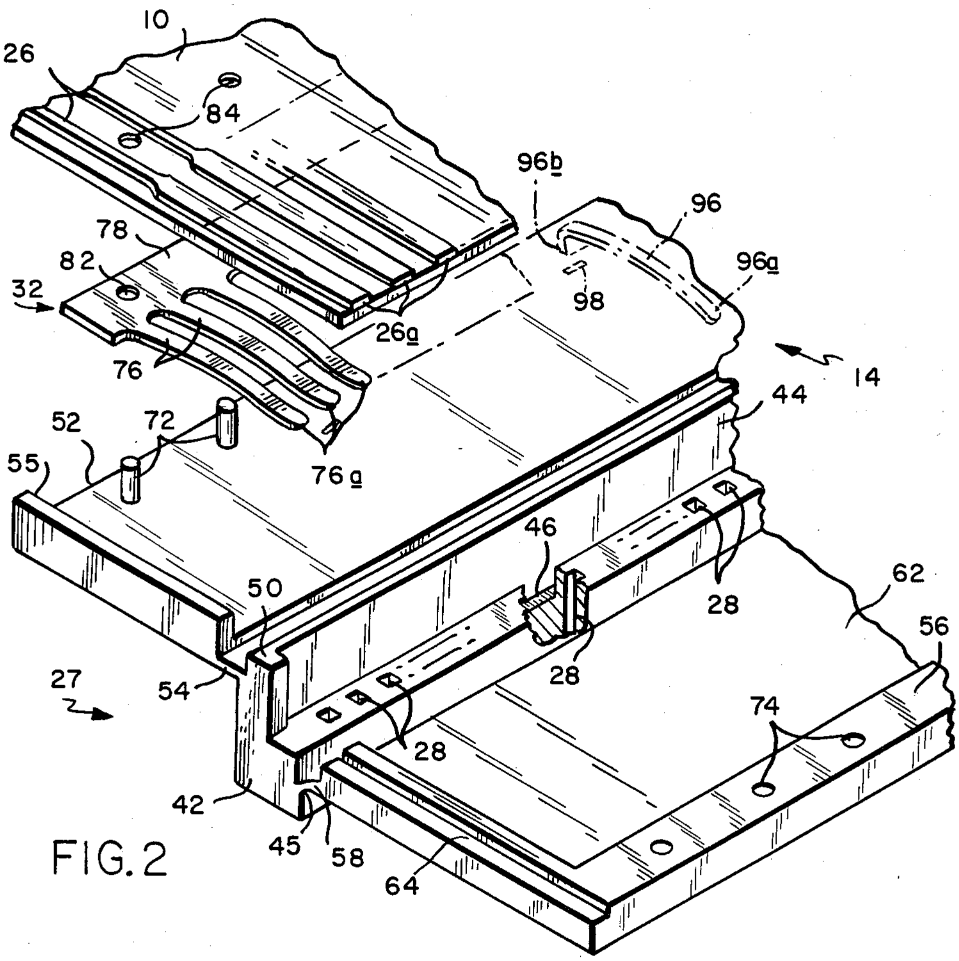
FIG. 2 is a similar view on a larger scale showing the components of the connection system in greater detail.

Referring now to FIG. 2, connector housing 27 comprises an elongated rectangular rigid bar or block 42 which contains the row of holes or passages 28. Preferably the outer ends of these passages have flares 28a to facilitate locating the row of passages 28 with relation to the row of tapered pin ends 24a in order to couple the connector to the PC board. As shown in FIG. 2, one side wall 44 of block 42 is higher than the opposite side wall 45 of that block. Also, a longitudinal slot 46 that extends parallel to the row of passages 28 is formed in the block bottom wall between side wall 44 and the adjacent walls of passages 28. Block 42 has, in addition, a pair of end walls 50 which extend from wall 44 to the common centerline of passages 28 in block 42.

Figure 3:
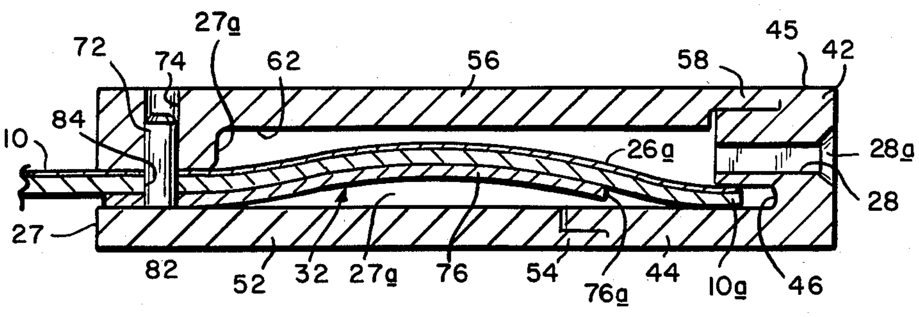
FIGS. 3 and 4 are views in medial section illustrating the operation of the FIG. 1 connection system.

As shown in FIGS. 2 and 3, a rigid rectangular panel 52 is connected adjacent to the free longitudinal edge of side wall 44 by a living hinge 54 which is actually constituted by an outer segment of side wall 44. Panel 52 can swing on hinge 54 from an open position shown in FIG. 2 to a closed position shown in FIG. 3. A pair of end walls 55 on panel 52 mate with block end walls 50 when panel 52 is in its closed position so that the panel and its end walls 55 are coplanar with and essentially extensions of the block side and end walls 44 and 50.

A similar rigid rectangular panel 56 is connected adjacent to the free edge of the opposite block side wall 45 by a living hinge 58 formed from an outer segment of wall 45. This hinge permits panel 56 to be swung between an open position shown in FIG. 2 to a closed position illustrated in FIG. 3. In the latter position, it constitutes an extension of block wall 45. A large, generally rectangular recess 62 is present in the upper (i.e. inner) surface of panel 56 as best seen in FIG. 2. The depth of recess 62 is approximately equal to the distance from the common center line of block passages 28 to the outer surface of the block side wall 45. The recess 62 is slightly longer than the row of passages 28 and extends almost to the free longitudinal edge of panel 56. The opposite ends of panel 56 have notches 64 at their upper (i.e. inner) edges to provide clearance for block end walls 50 when panel 52 is swung to its closed position. Thus, when both panels 52 and 56 are in their closed positions, they, along with the block 42, define the aforementioned housing cavity 27a referred to in connection with FIG. 1 that houses the end segment of circuit 10 and spring member 32.

The panels 52 and 56 are retained in their closed positions by a row of spaced-apart pins 72 projecting from the upper (i.e. inner) surface of panel 52 adjacent to the free longitudinal edge thereof. These pins are arranged to plug into a similar row of spaced-apart holes 74 located adjacent to the free longitudinal edge of panel 56 beyond recess 62 therein. The dimensions of the pins and holes are such that when the two panels are swung to their FIG. 3 closed positions and are pressed together, the pins 62 become press fitted in holes 72.

Still referring to FIG. 2, spring member 32 is made from a single, generally rectangular, thin (e.g. 5 mil) sheet of a suitable spring material such as beryllium-copper alloy. The length of member 32 corresponds more or less to that of panel 52 inboard of its end walls 55. The width of the member is approximately equal to the width of panel 52 plus the height of block side wall 44. The spring member 32 is slotted transversely at spaced apart locations along its length, each slot extending approximately three-fourths of the way across that member to define a lengthwise series of tines or teeth 76, the remaining unslitted edge margin of member 32 forming a rib or backbone 78 connecting the tines so that member 32 resembles a comb. The tines 76 constitute individual leaf springs and they are all upwardly bowed or arched to the same extent with their ends 76a being rounded and oriented so that they lie more or less in the same plane as rib 78. A row of longitudinally spaced-apart holes 82 are present in the spring member backbone 78 which holes are arranged to receive pins 72 when the spring member is positioned with its backbone 78 flush against the inner surface of panel 52 and its tines extending toward block 42. As noted previously, the spring member 32 is wider than panel 52 so that when panel 52 is moved to its closed position shown in FIG. 3, the tines overlie block wall 44 and are aligned with the passages 28 in that block.

The flexible printed circuit 10 is of more or less conventional construction. However, to accommodate the circuit to the present connection system, the width of circuit 10 is made approximately equal to the length of panel recess 62 and the terminal pads 26a of the circuit are laid out to be more or less in register with tines 76 when the circuit is positioned flush against the spring member 32 as shown in FIG. 3. Also, an appropriate row of holes 84 is provided in circuit 10 between circuit paths 26 to provide clearance for the locking pins 72 projecting from panel 52 through the holes 82 in the spring member.

When using the connection system, the spring member 32 is seated on panel 52, with the panel pins 72 projecting through holes 82 in that member. Then, circuit 10 is laid on top of the spring member so that the pins 72 project through holes 84 in that circuit. This automatically aligns the spring member tines 76 and the terminal pads 26a of circuit 10 with passages 28 in the block 42. Then panel 52 is swung to its closed position, care being taken to place the free edge of circuit 10 into the slot 46 in the block. Finally, panel 56 is swung to its closed position and the two panels are pressed together so that locking pins 62 project into and become press fitted in holes 74 in panel 56.

Figure 4:
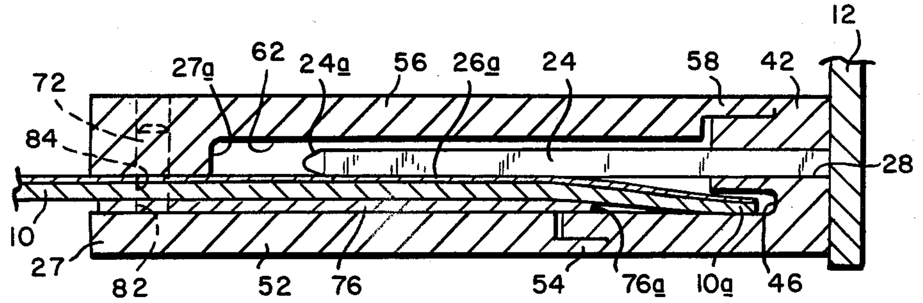

When the two panels are closed, the segment of circuit 10 inside housing cavity 27a is arched or bowed by the unflexed spring tines 76 to such an extent that the terminal pads 26a thereon are positioned beyond the common centerline of the post-receiving passages 28 in block 42 as shown in FIG. 3. Accordingly, when connector 14 is engaged on posts 24 of PC board 12 as shown in FIG. 4, those posts project through passages 28 into cavity 27a and engage terminal pads 26a, deflecting those pads and the underlying spring member tines 76 toward housing panel 52. The posts wipe the terminal pads 26*a* as they slide along those pads until the connector block 42 is firmly seated against the PC board 12. This wiping action removes any dirt or oxide deposits from those engaging surfaces thereby ensuring that intimate electrical contacts are made between pads 26*a* and posts 24. The posts 24 in cavity 27*a* also flex the spring member tines 76 to an extent that those tines firmly press the individual terminal pads 26*a* against the corresponding individual posts 24 so that such intimate contacts are maintained even though the circuits 10 and 12 may be jostled or vibrated as the system of which they are a part is transported or used.

Also, since the terminal pads 26*a* themselves contact the circuit board posts 24 to complete the electrical contacts between the two circuits, those pads can be stressformed, with the geometry and locations of those areas being precisely controlled to give each pad a direct contact radius or shape to fit each post 24 to minimize electrical resistance, facilitate expulsion of dirt, etc.

The fact that the circuit 10 is engaged by pins 72 and compressed between the free ends of panels 52 and 56 as shown in FIGS. 3 and 4 means that the connector gives considerable strain relief to circuit 10 so that tensile forces on that circuit are unlikely to pull the circuit from the connector or to affect its electrical connections to posts 24.

It is important to note also that the connections achieved between circuits 10 and 12 using connector 14 are made directly between conductors on those two circuits, i.e. between printed circuit path 26*a* of circuit 10 and post 28 of PC board 12. Connector 14 provides no electrical paths whatsoever between the two circuits and no soldering, crimping or welding is required in order to make the connection between circuits 10 and 12. Thus connector reliability is maximized. The only member therein that may, although not necessarily, be conductive is spring member 32. However that member does not conduct current between the two circuits. This means that the material for spring member 32 can be selected solely on the basis of its resiliency or spring constant without compromising the current-carrying ability of the connector 14.

The connection of circuit 10 to PC board 12 using connector 14 can be accomplished quite easily since the technician can feel with his fingers that the connector housing 27 is more or less aligned with the row of terminal posts 24 and that the row of tapered post ends 24*a* have found their way into the flared ends of the passages 28. Then, the technician only has to press the connector housing against the PC board. No manipulation of parts is required to lock the connector to the PC board since the resilient engagement of the circuit pads 26*a* against the sides of posts 28 suffice to hold the connector firmly to the PC board. Indeed, the technician does not even have to see the connector in order to make the connection. Similarly, if it becomes necessary to disconnect circuits 10 and 12, this can be accomplished simply by grasping housing 27 and pulling it away from the PC board.

Although connector 14 is usually permanently connected to circuit 10, if for some reason it becomes necessary to detach the connector from that circuit, this may be accomplished by inserting a knife blade between the free longitudinal edges of panels 52 and 56 and prying those two panels apart. On the other hand, such reopening of the connector can be prevented by coating pins 72 with epoxy cement prior to swinging panels 52 and 56 to their closed positions on by heat-staking the pins.

It is also important to note that the connector 14 is designed so that when the connector is properly installed on the end of circuit 10, its panels 52 and 56 are not subjected to excessive outward or buckling forces when the connector is impaled on pins 24 which forces might tend to damage the panels or their hinges 54 and 58. More particularly, as seen in FIG. 4, the load due to the bias of the spring member 32 is transmitted not to the panels 52 and 56 but to the rigid solid block 42 and to the relatively thick, rigid opposite edge portion of housing 27 at pins 72.

Figure 5:
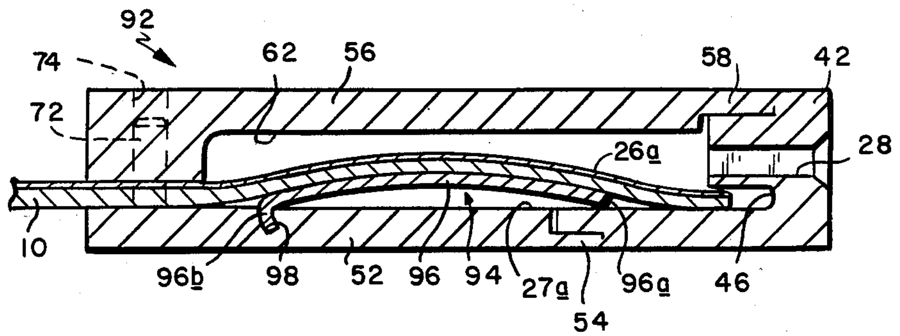
FIG. 5 is a similar view of another connector embodiment.

Refer now to FIG. 5 which shows generally at 92 a second embodiment of my connector. Connector 92 is the same as connector 14 described above except that it incorporates slightly different spring means, indicated generally at 94, to bias the circuit terminal pads 26*a* against the posts 24 of the PC board. Spring means 94 comprise a series of separate bowed or arched leaf springs 96 similar to tines 76. Each spring 96 has a flattened end 96*a* similar to tine end 76*a*. However, the opposite end of each spring 96 is bent down to form a hook 96*b*. The hooked ends of springs 96 are arranged to be engaged in a row of slots or holes 98 spaced apart along panel 52 adjacent to the free longitudinal edge thereof. One of these slots and the spring 96 therein are also shown in phantom at the righthand side of FIG. 2. The slots 98 and the springs therein are aligned with the passages 28 in block 42 of the connector housing. The springs 96 function in exactly the same way as the spring member tines 76 described above and the connector 92 otherwise possesses all of the advantages of connector 14.

Figure 6:
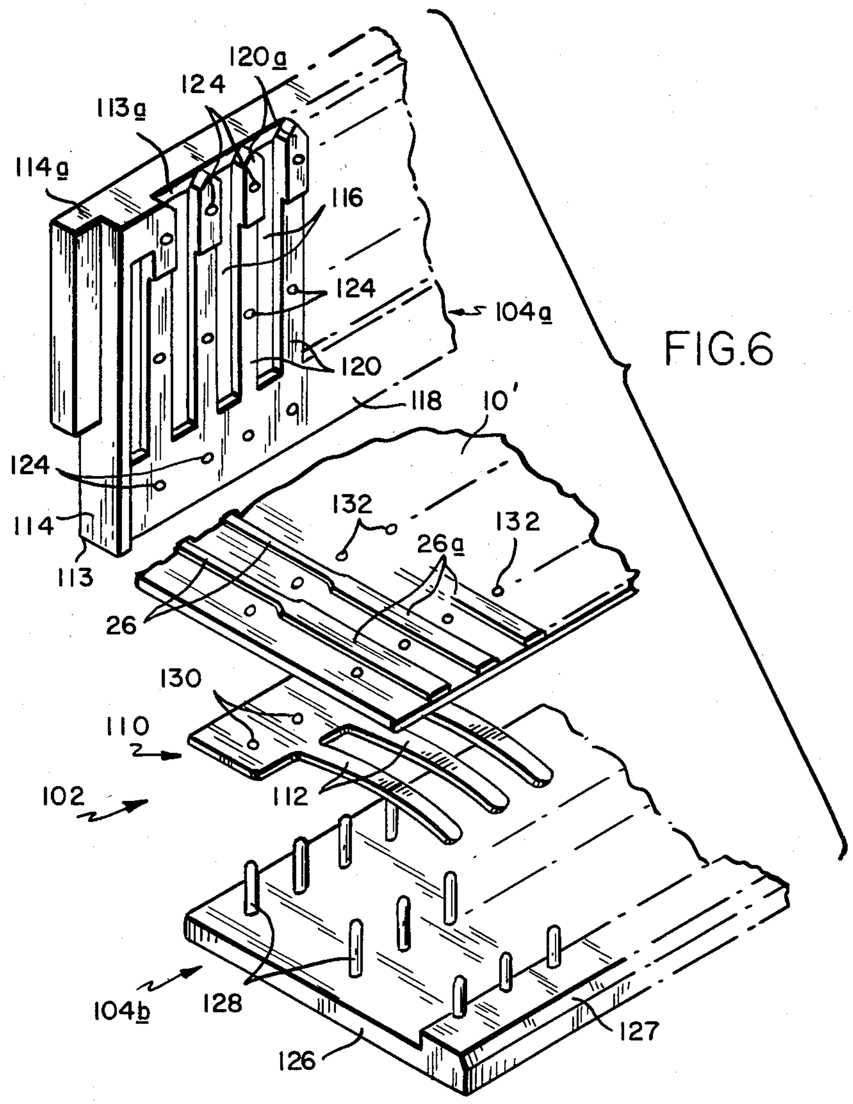
FIG. 6 is a view similar to FIG. 2 of a third connector embodiment.
Figure 7:
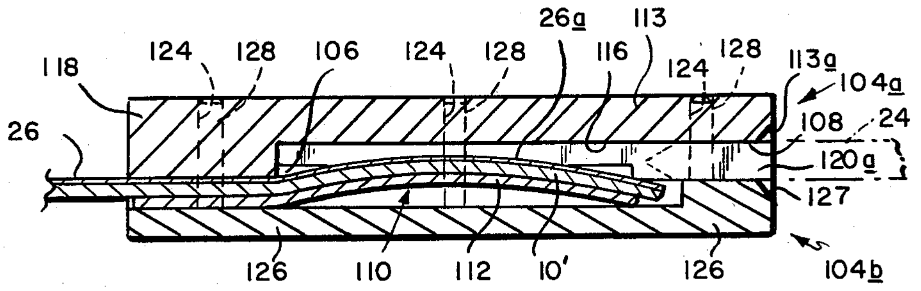
FIG. 7 is a view similar to FIG. 3 of the FIG. 6 connector.

Refer now to FIGS. 6 and 7 which depict a connector, shown generally at 102, which is particularly suitable for connecting a flexible circuit or jumper 10', to a PC board 12 whose terminals posts or pins 24 are very close together, e.g. 0.05 inch on center. Connector 102 comprises a pair of mating rigid panel-like housing sections 104*a* and 104*b* which are arranged to clamp to opposite surfaces of an edge margin of circuit 10' that carries the circuit's terminal pads 26*a*. When the two housing sections are clamped together as shown in FIG. 7, they define an internal cavity 106 and a row of closely spaced post-receiving passages 108 extending along a common longitudinal edge of the two housing sections and which lead into cavity 106.

Positioned inside cavity 106 along with the end or edge segment of circuit 10' is a spring member 110 which deflects the segment of circuit 10' in cavity 106 so that the individual terminal pads 26*a* thereon overlie or overhang the row of passages 108. Spring member 110, like member 32 described above, includes a series of parallel arched tines 112, each of which constitutes an individual leaf spring. The spring member 110 may be stamped from a single metal sheet like spring member 32 in FIG. 2 or the tines 112 may be separate springs like springs 96 in FIG. 5. In either event, their function is to engage behind and deflect the end segment of circuit 10' and particularly the terminal pads 26*a* thereon so that those pads intercept or overhang the row of passages 108. Therefore, when the PC board posts 24 project through passages 108 into cavity 106 as shown in FIG. 7, they engage and deflect the printed circuit pads 26*a* so as to establish separate, direct, intimate electrical contacts between those pads and the corresponding posts, all as described above in connection with FIGS. 1 to 5.

Still referring to FIGS. 6 and 7, housing section 104*a* comprises a generally rectangular rigid plastic panel 113 having a pair of thin end walls 114*a* which are somewhat higher than the remainder of the panel. Also, each of those end walls has an ear segment 114*a* that is somewhat thicker than the rest of the endwall. Formed in the underside of panel 113 is a series of transverse slots 116. These slots extend from the longitudinal edge 113*a* of panel 113 adjacent to ears 114*a* almost to the opposite edge of the panel thereby leaving a longitudinal rib 118 adjacent to that opposite edge. The spacing of the slots 116 in panel 113 corresponds to the spacing of terminal pads 26*a* and the slots are somewhat longer than those pads. Thus, a series of ribs 120 exist between the slots 116 which correspond more or less to the spaces between circuit pads 26*a*.

The ends of ribs 120 adjacent to panel edge 113*a* have raised areas or bosses 120*a* to strengthen the ribs at those locations and to help define the flared mouths of passages 108. Also, three rows of tiny holes 124 extend through panel 113. The holes 124 in one row extend through bosses 120*a*. A second row of holes extends along the longitudinal centerline of panel 113, there being one hole 124 in each rib 120. The third row of holes extends along rib 118. The corresponding holes in the three rows are all aligned and lie between the panel slots 116.

The other housing section 104*b* consists of a generally rectangular rigid panel 126 which has more or less the same length and width dimensions as panel 113. Panel 126 is essentially flat except for a longitudinal rib 127 extending along its forward edge which has the same function as bosses 120*a* and three rows of pins 128. These pins are positioned on panel 126 so that when panel 126 and panel 113 are placed in superposition, the pins are aligned with, and will project into, holes 124.

The spring member 110 also has a row of holes 130 which are arranged to receive the row of pins 128 adjacent to the rear edge of panel 126 so that the spring member 110 can be seated on panel 126 with its arched tines 112 bowing away from that panel. Three rows of clearance holes 132 are also provided in the end segment of circuit 10',the holes all lying between the terminal pads 26*a* so that circuit 10' can be impaled on pins 128 over spring member 110.

When the two housing sections 104*a* and 104*b* are placed in register, with circuit 10' and spring member 110 between them, they can be pressed together so that the pins 128 on section 104*b* projecting through the spring member and circuit are press fitted in the corresponding holes 124 in housing section 104*a* so that the two sections are held fast together as shown in FIG. 7. When the sections are so clamped together, the outer end portions of the slot 116 walls in housing section 104*a*, together with the inner surface of housing section 104*b*, define the row of passages 108 that receive the posts 24 of the PC board. The inner end portions of the slots 116, on the other hand, help to define the cavity 106 in the housing that accommodates the spring member 110 and printed circuit 10'.

While the illustrated spring member 110 has a separate spring 112 behind each terminal pad 26*a* of circuit 10', it is also possible to half the number of springs 112 and double their widths so that each spring engages behind and biases a pair of adjacent terminal pads 26*a*. In any event, the connector illustrated in FIGS. 6 and 7 has all of the attributes described above possessed by connector 14.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings be interpreted as illustrative and not in a limiting sense.

It is also understood that the following claims are intended to cover all of the generic and specific features of the invention herein described.

We claim:

1. A flexible circuit connection system comprising

A. a printed circuit board having row of terminal posts projecting therefrom, said terminal posts having selected centerline spacings;

B. a flexible circuit having an end segment carrying a corresponding row of conductive areas on one surface thereof, said areas having substantially the same centerline spacings as said posts; and C. a connector including 1. a rigid housing having an elongated relatively narrow bottom wall and a pair of opposite side walls whose lengths correspond to the length of the bottom wall, one of said side walls being movable with respect to the opposite side wall between an open position wherein it is disposed away from the other side wall and a closed position wherein it extends parallel to and mates with the opposite side wall to define a cavity in the housing,
2. means defining a row of post-receiving passages in said bottom wall leading to said cavity, said passages having substantially the same centerline spacings as said posts and said conductive areas,
3. means for locating an end segment of said flexible circuit in said housing cavity when said movable side wall is in its open position so that when said side wall is moved to its closed position, the conductive areas of said circuit end segment are aligned with said passages,
4. biasing means in said cavity for engaging and flexing said circuit end segment so that the conductive areas thereon overhang said passages so that when the connector housing is impaled on said posts with each of said posts projecting through a corresponding one of said passages into said cavity, each of said posts intercepts and intimately contacts the corresponding one of said conductive areas of said circuit, and
5. means for fixing said one movable side wall in its closed position.

2. The system defined in claim 1 wherein

A. said housing comprises a pair of separate coextensive, mating, rigid, generally rectangular panels, said panels constituting said housing opposite side walls and corresponding mating edges of said panels constituting said housing bottom wall; and B. a row of slots in said corresponding mating edges of said panels which slots form said row of passages when said panels are mated.

3. The system defined in claim 1 where said housing comprises

A. a rigid block constituting said housing bottom wall and containing said row of passages;

B. first and second mating rigid panels constituting said housing opposite side walls and, with said block, defining said housing cavity; and C. hinge means connecting corresponding edges of said panels adjacent to opposite side edges of said block.

4. The connection system defined in claim 1 wherein said posts and said passages have similar rectangular cross-sections.

5. The connection sytem defined in claim 1 wherein said posts and said passages have similar round cross-sections.

6. The connection system defined in claim 1

A. wherein said biasing means comprise a row of substantially parallel leaf springs which are similarly bowed away from a first housing side wall, said springs having substantially the same centerline spacings as said posts and said passages; and B. further including means in said housing for positioning said springs with respect to said row of passages so that a different spring is aligned with each of said passages.

7. The connection system defined in claim 1 wherein said fixing means include A. hinge means connecting a longitudinal edge of said movable side wall to a longitudinal edge of said housing bottom wall; and B. means for anchoring the opposite longitudinal edge of said movable side wall to the other housing side wall.

8. The connection system defined in claim 7 wherein said hinge means are constituted by a living hinge formed integrally with said movable side wall and said bottom wall.

9. The connection system defined in claim 7 wherein said anchoring means comprise A. a set of one or more pins projecting from one housing side wall; and B. a corresponding set of one or more holes in the other housing side wall positioned and dimensioned to tightly receive said pins when said movable side wall is in its closed position.

10. The connection system defined in claim 6 wherein said positioning means comprise a row of slots in the side wall of said housing opposite to said first side wall, said row of slots extending parallel to said row of passages, with each slot in the row of slots being aligned with a different one of said passages.

11. The connection system defined in claim 6 wherein

A. said biasing means comprise a comb-like spring member whose teeth constitute said springs; and B. said positioning means comprise interfitting means on said comb-like spring member and on a housing side wall.

12. A connection system comprising

A. a rigid housing having an elongated narrow bottom wall and a pair of side walls whose lengths correspond to that of said bottom wall, at least one of said side walls being movable with respect to the other side wall between an open position wherein said movable side wall is spaced from said other side wall and a closed position wherein said movable side wall is disposed parallel to said other side wall so as to define with said other side wall and said bottom wall a cavity in the housing, and means defining a row of post-receiving passages in said bottom wall leading into said cavity, said passages having selected centerline spacings; and B. spring means for positioning in said housing cavity, said spring means including a set of parallel leaf springs having arched portions, the number of springs in the set corresponding to the number of passages in said row of passages;

C. means for mounting said springs in a row in said cavity so that 1. the springs are in register with and extend parallel to the passages in said row of passages, and
2. the arched portions of said springs overhang corresponding ones of said passages in said row of passages when said movable side wall is in its closed position; and D. means for fixing said one movable side wall in its closed position.

13. The connection system defined in claim 12 and further including

A. a flexible printed circuit having a row of conductive printed circuit areas on one side thereof at an edge margin of said circuit, the centerline spacings of said conductive areas being substantially equal to the centerline spacings of said passages; and B. means for locating said circuit edge margin in said housing cavity so that said conductive areas are aligned with corresponding passages in said row of passages and corresponding springs in said row of springs.

14. The connection system defined in claim 13 wherein said locating means comprise means projecting from a side wall through said circuit at a location thereon spaced from said margin edge.

15. The connection system defined in claim 14 wherein

A. said locating means include first segments of a set of pins projecting from a connector side wall; and B. said fixing means include second segments of said set of pins and a corresponding set of holes in the other housing side wall for snugly receiving said pin second segments when said one movable side wall is in its closed position.

16. The connection system defined in claim 15 and further including a printed circuit board having a row of terminal posts projecting therefrom, said terminal posts having centerline spacings equal to those of said passages and being received in the passages of said row of passages.

* * * * *